United States Patent
Lee et al.

(10) Patent No.: US 8,979,313 B2
(45) Date of Patent: Mar. 17, 2015

(54) SEMICONDUCTOR LIGHT SOURCE DEVICE

(71) Applicant: Industrial Technology Research Institute, Chutung, Hsinchu (TW)

(72) Inventors: Chun-Hsing Lee, Hsinchu (TW); Hung-Lieh Hu, Hsinchu (TW); Ya-Hui Chiang, Zhongli (TW); Chao-Wei Li, Hsinchu (TW); Chen-Kun Chen, Lugang Town (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 213 days.

(21) Appl. No.: 13/710,880

(22) Filed: Dec. 11, 2012

(65) Prior Publication Data

US 2013/0168710 A1    Jul. 4, 2013

(30) Foreign Application Priority Data

Dec. 29, 2011    (TW) .............................. 100149645 A

(51) Int. Cl.
| | |
|---|---|
| *H01L 27/15* | (2006.01) |
| *H01L 33/46* | (2010.01) |
| *F21V 8/00* | (2006.01) |
| *G02B 6/42* | (2006.01) |

(52) U.S. Cl.
CPC ................ *H01L 27/15* (2013.01); *H01L 33/46* (2013.01); *G02B 6/4206* (2013.01); *G02B 6/4228* (2013.01); *G02B 6/4298* (2013.01); *G02B 6/0006* (2013.01)
USPC ............................................ 362/257; 257/98

(58) Field of Classification Search
None
See application file for complete search history.

(56) References Cited

U.S. PATENT DOCUMENTS

| | | | |
|---|---|---|---|
| 6,260,094 B1 | 7/2001 | Davis et al. | |
| 6,260,994 B1 | 7/2001 | Matsumoto et al. | |
| 6,318,887 B1 | 11/2001 | Matsumoto | |
| 6,438,302 B1 | 8/2002 | Utsui et al. | |
| 6,560,038 B1 * | 5/2003 | Parkyn et al. | ................ 359/726 |
| 6,817,746 B2 * | 11/2004 | Steiner et al. | ................ 362/556 |
| 6,918,693 B2 | 7/2005 | Ota et al. | |
| 7,198,397 B2 | 4/2007 | Bennett et al. | |

(Continued)

FOREIGN PATENT DOCUMENTS

| | | |
|---|---|---|
| CN | 1742217 A | 3/2006 |
| TW | 200423821 | 11/2004 |
| TW | 200527025 | 8/2005 |

OTHER PUBLICATIONS

Noordmans, "Quantitative Assessment of Degradation of the Optical Quality of Rigid Endoscopes in Clinical Practice", Design and Quality for Biomedical Technologies, 2008, vol. 6849, pp. 1-8.

(Continued)

*Primary Examiner* — Britt D Hanley
(74) *Attorney, Agent, or Firm* — Muncy, Geissler, Olds & Lowe, P.C.

(57) ABSTRACT

A semiconductor light source device is provided. The semiconductor light source device includes a light guide, at least one semiconductor light source set and at least one light transformation coupler. The light transformation coupler is disposed between the semiconductor light source set and the light guide for guiding the light emitted from the semiconductor light source set to the light guide. The light transformation coupler has an inclined surface and a curved surface. The inclined surface is a multi-level inclined surface with several slopes.

13 Claims, 9 Drawing Sheets

(56) References Cited

U.S. PATENT DOCUMENTS 7,229,201 B2 6/2007 Krupa et al.
7,305,159 B1 12/2007 Cummings et al.
7,621,677 B2 11/2009 Yang et al.

OTHER PUBLICATIONS

Noordmans, "Optical Quality Assessment of Rigid Endoscopes During Clinical Lifetime", Endoscopic Microscopy, 2006, vol. 6082, pp. 1-7.

Igarashi, et al., "Novel Endoscopic Imaging System for Early Cancer Diagnosis", Endoscopic Microscopy II, 2007, vol. 6432, pp. 1-9.

Mizuno, et al., "Narrow Band Imaging Technique", Techniques in Gastrointestinal Endoscopy, Apr. 2003, vol. 5, No. 2, pp. 79-81.

Nishikawa, et al., "A Novel Imaging System of Optical Detection on Cancers and Tissues in Gastrointestinal Endoscopt Using High-Color-Rendering White and Color Tunable LEDS", Endoscopic Microscopy V, 2010, vol. 7558, pp. 1-5.

\* cited by examiner

SEMICONDUCTOR LIGHT SOURCE DEVICE

This application claims the benefit of Taiwan application Serial No. 100149645, filed Dec. 29, 2011, the disclosure of which is incorporated by reference herein in its entirety.

TECHNICAL FIELD

The disclosure relates in general to a light source device, and more particularly to a semiconductor light source device.

BACKGROUND

Along with the development and advance in the optical technology, various optical products are constantly provided. The development in the industry of optical products is mainly directed towards the technologies of light source system, light guide system, and image capturing system.

Some optical products combine the above technologies. For example, the optical system such as endoscope or microscope light source needs to integrate the development of light source system, light guide system and image capturing system, and involves high complexity level.

Due to the high level of complexity, many technical bottlenecks are encountered and impede the development in the industry of the optical products. Currently, a large number of research personnel are devoted to the research in related technologies to promote industrial development.

SUMMARY

According to one embodiment, a semiconductor light source device is provided. The semiconductor light source device includes a light guide, at least one semiconductor light source set and at least one light transformation coupler. The light transformation coupler is disposed between the semiconductor light source set and the light guide for guiding the light emitted from the semiconductor light source set to the light guide. The light transformation coupler has an inclined surface and a curved surface. The inclined surface is a multi-level inclined surface with several slopes.

Figure 1:
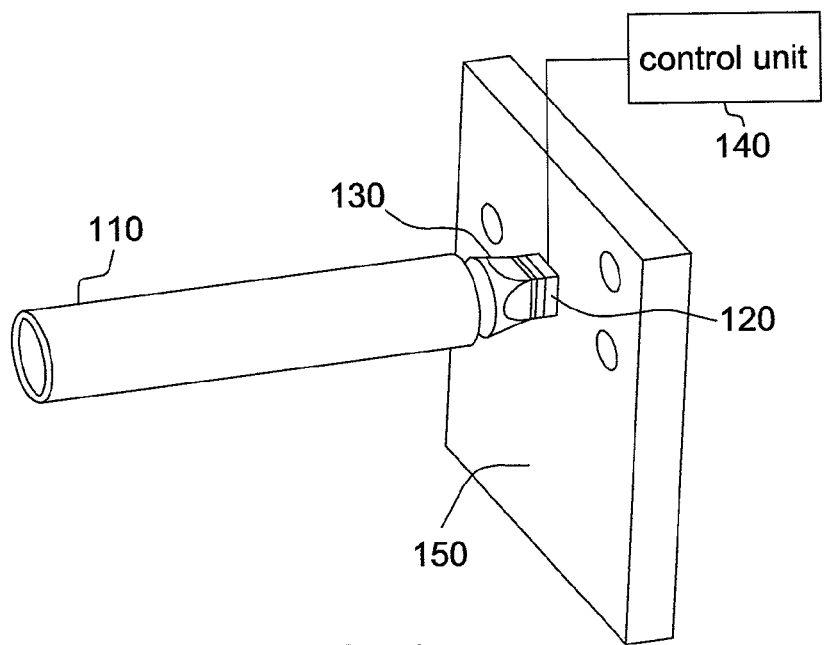
FIGS. 1 to 2 illustrate schematic diagrams of a semiconductor light source device of a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF DISCLOSED EMBODIMENTS

First Embodiment

Figure 2:
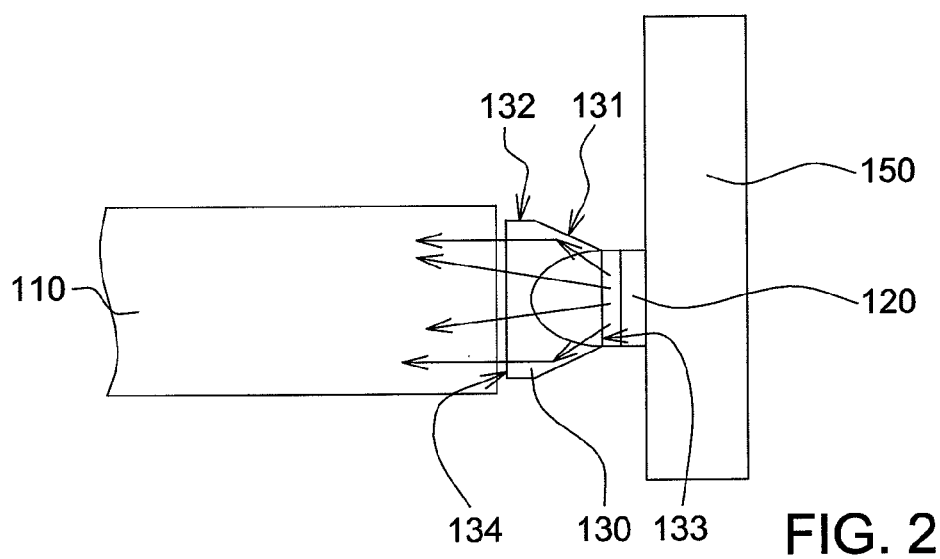
Figure 3A:
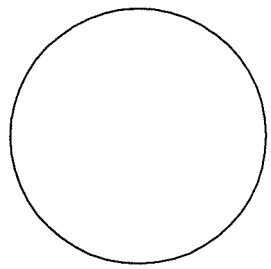
FIGS. 3A to 3E illustrate schematic diagrams of a light transformation coupler of the first embodiment various at various angles.
Figure 3B:
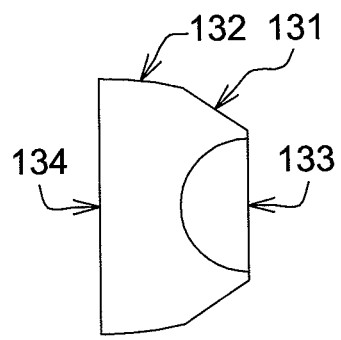
Figure 3C:
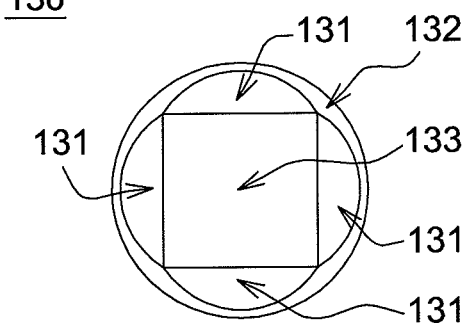
Figure 3D:
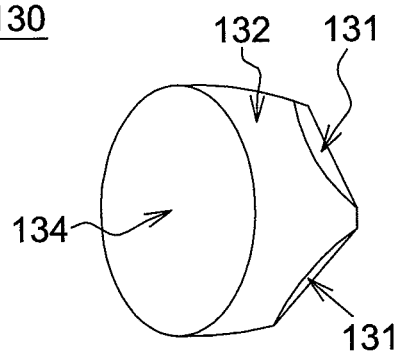
Figure 3E:
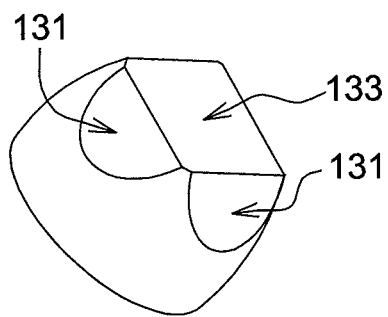

Referring to FIGS. 1 to 2 are schematic diagrams of a semiconductor light source 1000 device of a first embodiment are illustrated. The semiconductor light source device 1000, such as an endoscope or a microscope light source, includes a light guide 110, at least one semiconductor light source set 120, at least one light transformation coupler 130 and a control unit 140. The light guide 110, used for transmitting a light can be an optical fiber, for example. The semiconductor light source set 120 is formed by a semiconductor material such as a light emitting diode (LED), a laser diode (LD), a combination of several LEDs, several LDs, or a combination of at least one LED and at least one LD. The light transformation coupler 130, used for guiding the projection direction of the light, is formed by such as a transparent material or a reflective material. The control unit 140, used for controlling the semiconductor light source set 120, can be a control chip, a firmware circuit or a storage medium storing several programming codes, for example.

The light guide 110 may be realized by a solid optical fiber, an optical fiber bundle or a combination thereof; and may be formed by such as glass, quartz, liquid or plastics, and may be soft or hard.

The semiconductor light source set 120 is disposed on the substrate 150, which provides the semiconductor light source set 120 with necessary power and heat dissipation function.

Referring to FIGS. 3A to 3E, schematic diagrams of a light transformation coupler 130 of the first embodiment at various angles are illustrated. The light transformation coupler 130 is disposed between the semiconductor light source set 120 and the light guide 110 and guides the light emitted from the semiconductor light source set 120 to the light guide 110 by way of diffraction or reflection. The light transformation coupler 130 has an inclined surface 131 and a curved surface 132. The inclined surface 131 and the curved surface 132 are used for reflecting the light emitted from the semiconductor light source set 120. The shape of the curved surface 132 may be spherical, elliptic (oval-spherical) or parabolic. Let FIGS. 3A to 3E be taken for example. The light transformation coupler 130 has four inclined surfaces 131 and one curved surface 132, wherein the shape of the curved surface 132 is elliptic (oval-spherical). The light transformation coupler 130 is not limited to the design illustrated in FIGS. 3A to 3E, and any design capable of guiding the projection direction of the light emitted from the semiconductor light source set 120 (indicated in FIG. 2) by way of diffraction or reflection is within the scope of protection of the disclosure. In other embodiments, the light transformation coupler 130 may have only the inclined surface or the curved surface, but is not limited to the design illustrated in FIGS. 3A to 3E.

The light transformation coupler 130 has a first terminal surface 133 and a second terminal surface 134. In the embodiment indicated in FIG. 2, the first terminal surface 133 is a light input terminal surface, and the second terminal surface 134 is a light output terminal surface. The shape of the first terminal surface 133 is substantially the same with that of the semiconductor light source set 120 (indicated in FIG. 2), and is such as squared. The shape of the light guide 110 is substantially the same with that of the cross-sections of the second terminal surface 134 (indicated in FIG. 2), and is such as circular.

Referring to FIG. 2, the first terminal surface 133 of the light transformation coupler 130 can be separated from the semiconductor light source set 120 by a gap, or can be contacted with the semiconductor light source set 120. In the present embodiment, the gap between the first terminal surface 133 of the light transformation coupler 130 and the semiconductor light source set 120 is smaller than or equal to 0.5 mm. The second terminal surface 134 of the light transformation coupler 130 may be separated from the light guide 110 by a gap, or can be contacted with to the light guide 110.

Figure 4:
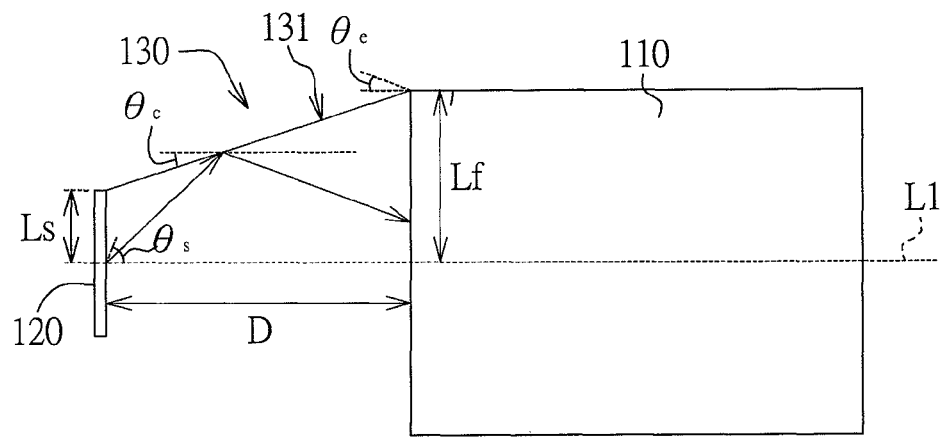
FIG. 4 illustrates a schematic diagram of an optical path of the light transformation coupler of the first embodiment.

Referring to the embodiment indicated in FIG. 4, a schematic diagram of an optical path of the light transformation coupler 130 of the first embodiment is shown. The light emitted from the semiconductor light source set 120 is reflected by the inclined surface 131 or the curved surface 132 of the light transformation coupler 130 (indicated in FIGS. 3A to 3E) and then is guided to the light guide 110. For example, the semiconductor light source set 120 of the present embodiment is squared, and the cross-section of the light guide 110 is circular. The reception angle of the light guide 110 is within a limited range. The maximum reception angle $\theta_f$ of the light guide 110 is related to its numerical aperture (NA). The maximum emission angle of the light emitted from the semiconductor light source set 120 is denoted as $\theta_s$. The light emitted from the semiconductor light source set 120 has a larger angle and fails to satisfy the reception range of the light guide 110. By using the inclined surface 131 or the curved surface 132 (indicated in FIGS. 3A to 3E) which is disposed on the light transformation coupler 130 and has a certain slope, the light reflected by the inclined surface 131 or the curved surface 132 will change its proceeding angle and enter the input terminal surface of the light guide 110, such that the incident angle of the reflected light satisfies the reception angle of the light guide 110.

If the maximum emission angle $\theta_s$ of the semiconductor light source set 120 is smaller than the maximum reception angle $\theta_f$ of the light guide 110, then the slope of the inclined surface 131 is expressed as formulas (1):

$$D^*\tan\theta_c = L_f - L_s \quad (1)$$

Wherein, $\theta_c$ denotes the angle between the inclined surface 131 and the center axis L1; D denotes the projection length of the inclined surface 131 on the center axis L1; $L_f$ denotes the radius of the light guide 110; $L_s$ denotes a half of an edge of the semiconductor light source set 120.

If the maximum emission angle $\theta_s$ of the semiconductor light source set 120 is greater than the maximum reception angle $\theta_f$ of the light guide 110, then the slope of the inclined surface 131 is expressed as formulas (2):

$$|\theta_s - 2\times\theta_c| \leq \theta_f, D^*\tan\theta_c \leq L_f - L_s \quad (2)$$

Figure 5:
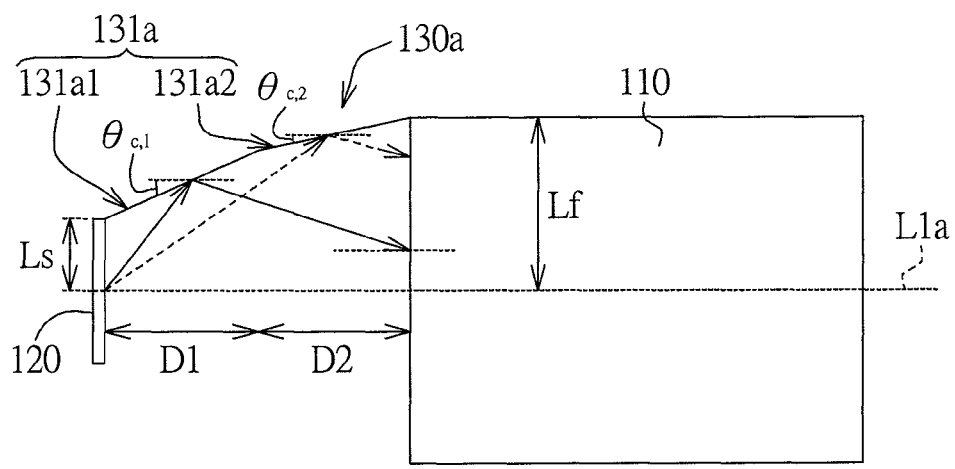
FIG. 5 illustrates a schematic diagram of an optical path of a light transformation coupler of another embodiment.

Referring to FIG. 5, a schematic diagram of an optical path of a light transformation coupler 130a of another embodiment is illustrated. In an embodiment, the inclined surface 131a of the light transformation coupler 130a may be realized by a multi-level inclined surface with several slopes, and the curved surface (not illustrated) may also be realized by a multi-level curved surface with several slopes. For example, the inclined surface 131a of the light transformation coupler 130a is expressed as formulas (3):

$$D_1^*\tan\theta_{c,1} + D_2^*\tan\theta_{c,2} \leq L_f - L_s, \theta_{c,2} \leq \theta_{c,1} \quad (3)$$

$D_1$ denotes the projection length of the first level inclined surface 131a1 on the center axis L1a; $D_2$ denotes the projection length of the second level inclined surface 131a2 on the center axis L1a; $\theta_{c,1}$ denotes the angle between the first level inclined surface 131a1 and the center axis L1a; $\theta_{c,2}$ denotes the angle between the second level inclined surface 131a2 and the center axis L1a.

In the above elaboration, a one-level inclined surface 131 and a two-level inclined surface 131a are taken for example. However, similar design may be applied in the implementation of multi-level inclined surface or multi-level curved surface.

Figure 6A:
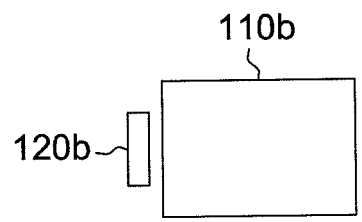
FIGS. 6A to 6B illustrate a schematic diagram of two types of semiconductor light source devices.
Figure 6B:
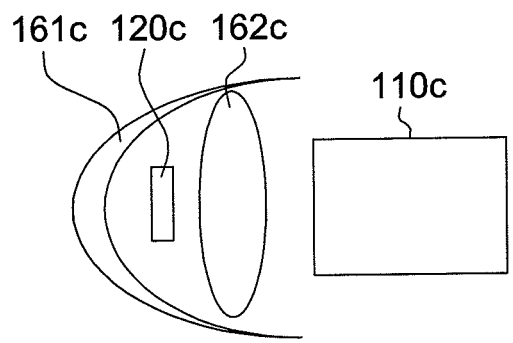
Figure 6C:
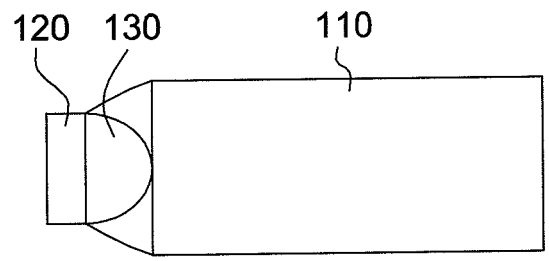
FIG. 6C illustrates a schematic diagram of the semiconductor light source device of the first embodiment.

Referring to FIGS. 6A to 6C, two types of semiconductor light source device 1000b, 1000c are illustrated. FIG. 6C shows a semiconductor light source device 1000 of the present embodiment. As indicated in FIG. 6A, the semiconductor light source set 120b may be directly coupled to the light guide 110b. As indicated in FIG. 6B, the light emitted from the semiconductor light source set 120c may be guided to the light guide 110c through the reflective mirror 161c and the condenser lens 162c. As illustrated in Table 1, the light guide 110 of the present embodiment has best performance in light extraction efficiency.

TABLE 1

|  | Light Guide 110b (FIG. 6A) | Light Guide 110c (FIG. 6B) | Light Guide 110 (FIG. 6C) |
| --- | --- | --- | --- |
| Light Extraction Efficiency | 47% | <20% | 76.4% |

Figure 7A:
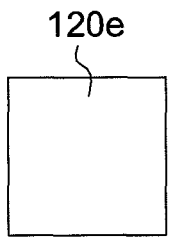
FIGS. 7A to 7B illustrate several embodiments of the shape of a semiconductor light source set.
Figure 7B:
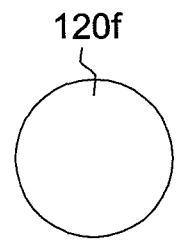

Referring to FIGS. 7A to 7B, several embodiments of the shape of semiconductor light source sets 120e and 120f are illustrated. In the embodiment of FIG. 7A, the semiconductor light source set 120e may be squared. In the embodiment of FIG. 7B, the semiconductor light source set 120f may be circular.

Figure 8A:
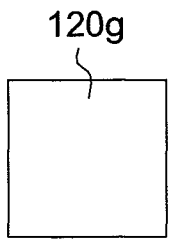
FIGS. 8A to 8B illustrate several embodiments of the quantity of a semiconductor light source set.
Figure 8B:
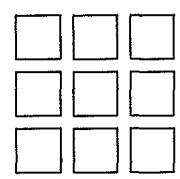

Referring to FIGS. 8A to 8B, several embodiments of the quantity of semiconductor light source sets 120g and 120h are illustrated. In the embodiment of FIG. 8A, the quantity of the semiconductor light source set 120g may be one. In the embodiment of FIG. 8B, the quantity of the semiconductor light source set 120h may be plural and the semiconductor light source sets 120h may be arranged in the form of a matrix.

Figure 9A:
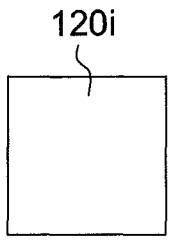
FIGS. 9A to 9D illustrate several embodiments of the color of a semiconductor light source set.
Figure 9B:
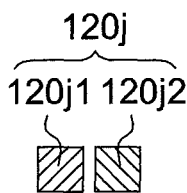
Figure 9C:
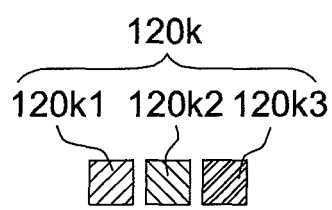
Figure 9D:
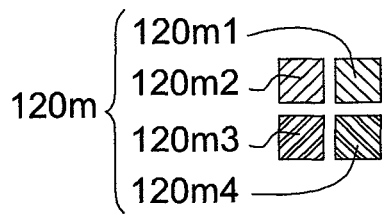

Referring to FIGS. 9A to 9D, several embodiments of the color of semiconductor light source sets 120i, 120j, 120k, 120m, 120n, and 120p are illustrated. In the embodiment of FIG. 9A, the semiconductor light source set 120i may be formed by a combination of an LED and phosphor material. For example, the semiconductor light source set 120i can be formed by a combination of a blue light LED and YAG (Yttrium aluminium garnet) phosphor material, a combination of a ultra-velvet LED and RGB (Red, Green and Blue) phosphor materials, or a combination of a ultra-velvet LED and BY (Blue and Yellow) phosphor materials. In the embodiment of FIG. 9B, the semiconductor light source set 120*j* may be formed by two LEDs 120*j*1 and 120*j*2. The LEDs 120*j*1 and 120*j*2 may have binary complementary color lights, such as blue light and yellow light. In the embodiment of FIG. 9C, the semiconductor light source set 120*k* may be formed by three LEDs 120*k*1, 120*k*2 and 120*k*3. The LEDs 120*k*1, 120*k*2 and 120*k*3 may have ternary complementary color lights, such as blue light, green light and red light. In the embodiment of FIG. 9D, the semiconductor light source set 120*m* may be formed by four LEDs 120*m*1, 120*m*2, 120*m*3 and 120*m*4; the LEDs 120*m*1, 120*m*2, 120*m*3 and 120*m*4 may have ternary complementary color lights and a wide color gamut. For example, the lights emitted from the LEDs 120*m*1, 120*m*2, 120*m*3 and 120*m*4 include blue, green, red and blue-green lights.

Figure 10A:
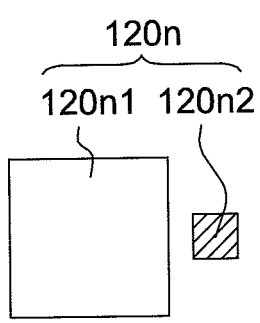
FIGS. 10A to 10B illustrate several embodiments of the color temperature of the semiconductor light source set.
Figure 10B:
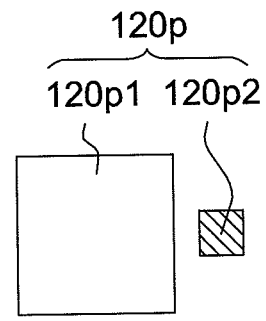

Referring to FIGS. 10A to 10B, several embodiments of the color temperature of semiconductor light source sets 120*n*, 120*p* are illustrated. The semiconductor light source set 120*n* may be formed by two LEDs 120*n*1 and 120*n*2, wherein the LED 120*n*1 emits a low color temperature white light, the LED 120*n*2 emits a blue light, and the combination of the two LEDs 120*n*1 and 120*n*2 increases the outputted color temperatures. The semiconductor light source set 120*p* may be formed by two LEDs 120*p*1 and 120*p*2, wherein the LED 120*p*1 emits a white light having high color temperature, the LED 120*p*2 emits a red light, and the combination of the two LEDs 120*p*1 and 120*p*2 reduces the outputted color temperatures. Through the above combinations, the ratio of blue light and white light having low color temperature is adjusted, or the ratio of the red light and the white light having high color temperature is adjusted as the change in the outputted color or color temperature. In another embodiment, the semiconductor light source sets 120*n* and 120*p* may be formed by two white light LEDs having the same color temperature and are combined with a blue light LED or a red light LED respectively, such that the semiconductor light source set 120*n* has a higher color temperature, and the semiconductor light source set 120*p* has a lower color temperature.

As disclosed above, the semiconductor light source device 1000 may be implemented by any design illustrated in FIGS. 9B to 10B. The control unit 140 may control respective ratio of the light emitted from any of the semiconductor light source sets 120*j*, 120*k*, 120*m*, 120*n* and 120*p* to change the presented color and color temperature.

Second Embodiment

Figure 11:
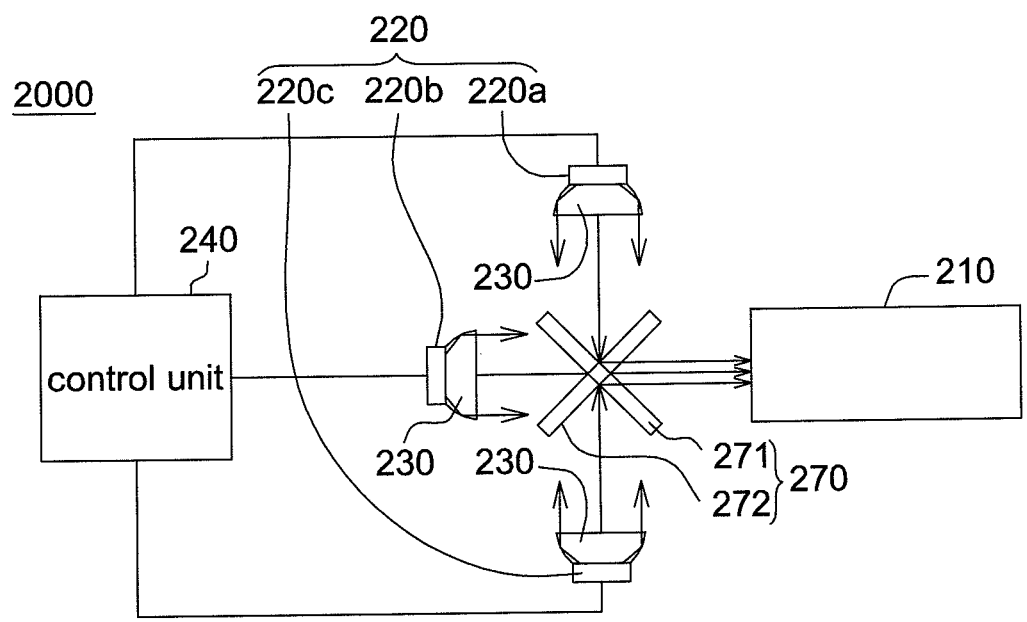
FIG. 11 illustrates a schematic diagram of a semiconductor light source device of a second embodiment.

Referring to FIG. 11, a schematic diagram show of a semiconductor light source device 2000 of a second embodiment is shown. The semiconductor light source device 2000 of the present embodiment is different from the semiconductor light source device 1000 of the first embodiment in that the present embodiment further employs a spectroscope group 270 used in conjunction with the lights emitted from several semiconductor light source set 220 (such as the semiconductor light source set 220*a*, 220*b* and 220*c*), and other similarities are not repeated.

In the embodiment indicated in FIG. 11, the quantity of the semiconductor light source sets 220*a*, 220*b* and 220*c* is plural, and the quantity of the light transformation couplers 230 is plural. The spectroscope group 270 is disposed between the light transformation couplers 230 and the light guide 210 for mixing the lights emitted from the semiconductor light source sets 220*a*, 220*b* and 220*c*.

Let the embodiment indicated in FIG. 11 be taken for example. The spectroscope group 270 includes two spectroscopes 271 and 272 arranged in a crisscross manner or an alternating manner. The spectroscopes 271 and 272 are transparent substrates, and may be formed by plastics, glass or optical crystalline. An optical coating is evaporated or electroplated on the spectroscopes 271 and 272 for allowing the lights with different wavelengths to pass through or for diffracting the lights by way of transmission through or reflection.

The light emitted from the semiconductor light source set 220*b* disposed at the left side may pass through the spectroscopes 271 and 272. The light emitted from the semiconductor light source set 220*a* disposed at the top is reflected by the spectroscope 271. The light emitted from the semiconductor light source set 220*c* disposed at the bottom is reflected by the spectroscope 272. Therefore, the lights emitted from the three semiconductor light source sets 220*a*, 220*b* and 220*c* are mixed by the spectroscope group 270.

The control unit 240 is electrically connected to the semiconductor light source sets 220*a*, 220*b*, and 220*c* for respectively controlling the brightness levels of the semiconductor light source sets 220*a*, 220*b* and 220*c*. When the lights emitted from the semiconductor light source sets 220*a*, 220*b* and 220*c* have different colors, different ratios of brightness may produce different colors of mixed light. When the lights emitted from the semiconductor light source sets 220*a*, 220*b* and 220*c* have different color temperatures, different ratios of brightness may produce different mixed color temperature.

Third Embodiment

Figure 12:
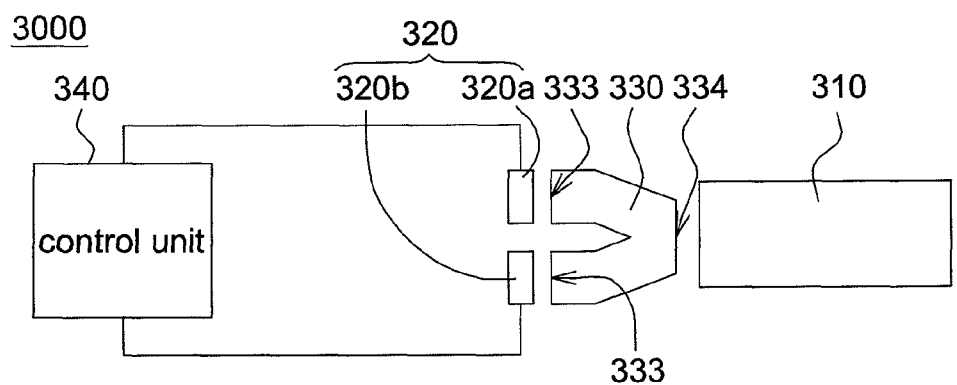
FIG. 12 illustrates a schematic diagram of a semiconductor light source device of a third embodiment.

Referring to FIG. 12, a schematic diagram of a semiconductor light source device 3000 of a third embodiment is illustrated. The semiconductor light source device 3000 of the present embodiment is different from the semiconductor light source device 1000 of the first embodiment in that the present embodiment further employs a light transformation coupler 330, and other similarities are not repeated.

In the embodiment indicated in FIG. 12, the quantity of the semiconductor light source set 320 is plural. For example, the semiconductor light source set 320 includes semiconductor light source sets 320*a* and 320*b*. The light transformation coupler 330 has several first terminal surfaces 333 and a second terminal surface 334. In the embodiment indicated in FIG. 12, the first terminal surface 333 is a light input terminal surface, and the second terminal surface 334 is a light output terminal surface. Each first terminal surface 333 corresponds to one of the semiconductor light source sets 320*a* and 320*b*. The shape of the first terminal surface 333 is substantially the same with that of the semiconductor light source sets 320*a* and 320*b* and is such as squared or circular. The shape of the second terminal surface 334 is substantially the same with the cross-section of the light guide 310, and is such as squared or circular.

The control unit 340 is electrically connected to the semiconductor light source sets 320*a* and 320*b* respectively for controlling the brightness levels of the semiconductor light source sets 320*a* and 320*b*. When the lights emitted from the semiconductor light source sets 320*a* and 320*b* have different colors, different ratios of brightness may produce different mixed colors. When the lights emitted from the semiconductor light source sets 320*a* and 320*b* have different color temperatures, different ratios of brightness may produce different mixed color temperature.

Fourth Embodiment

Figure 13:
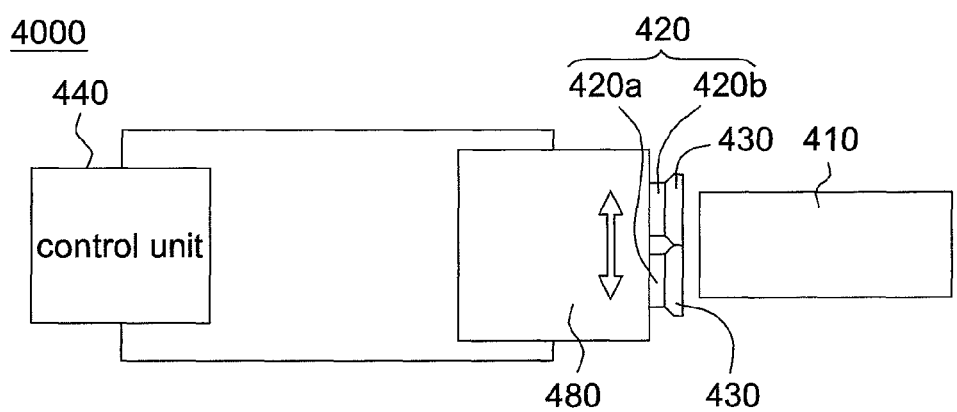
FIG. 13 illustrates a schematic diagram of a semiconductor light source device of a fourth embodiment.

Referring to FIG. 13, a schematic diagram of a semiconductor light source device 4000 of a fourth embodiment is illustrated. The semiconductor light source device 4000 of the present embodiment is different from the semiconductor light source device 1000 of the first embodiment in that the present embodiment further employs a movable platform 480, and other similarities are not repeated.

In the embodiment indicated in FIG. 13, the quantity of the semiconductor light source set 420 is plural. For example, the semiconductor light source set 420 includes two semiconductor light source sets 420a and 420b. The quantity of the light transformation coupler 430 is plural. Each light transformation coupler 430 is for guiding the light emitted by each of the semiconductor light source sets 420a and 420b. The light guide 410 receives at least a part of the light emitted from each of the semiconductor light source sets 420a and 420b. A movable platform 480 is used for moving the semiconductor light source sets 420a and 420b and the light transformation couplers 430 to adjust the ratio of the lights emitted from the semiconductor light source sets 420a and 420b and received by the light guide 410.

The movable platform 480 may be moved or rotated to change the relative position between the light guide 410 and the semiconductor light source sets 420a and 420b. Thus, the relative ratio of the lights emitted from the semiconductor light source sets 420a and 420b and received by the light guide 410 is changed.

The control unit 440 is electrically connected to the movable platform 480 for controlling the movement or rotation of the movable platform 480. When the lights emitted from semiconductor light source sets 420a and 420b have different colors, the relative ratio of the lights emitted from the semiconductor light source sets 420a and 420b and received by the light guide 410 is changed such that the mixed color is changed accordingly. When the lights emitted from the semiconductor light source sets 420a and 420b have different color temperatures, the relative ratio of the lights emitted from the semiconductor light source sets 420a and 420b and received by the light guide 410 is changed such that the mixed color temperature is changed accordingly.

In an embodiment, the light transformation coupler 430 is not employed, and the lights emitted from the semiconductor light source sets 420a and 420b are directly received the light guide 410. Likewise, the movable platform 480 may be moved or rotated to change the relative ratio of the lights emitted from the semiconductor light source sets 420a and 420b and received by the light guide 410.

Fifth Embodiment

Figure 14A:
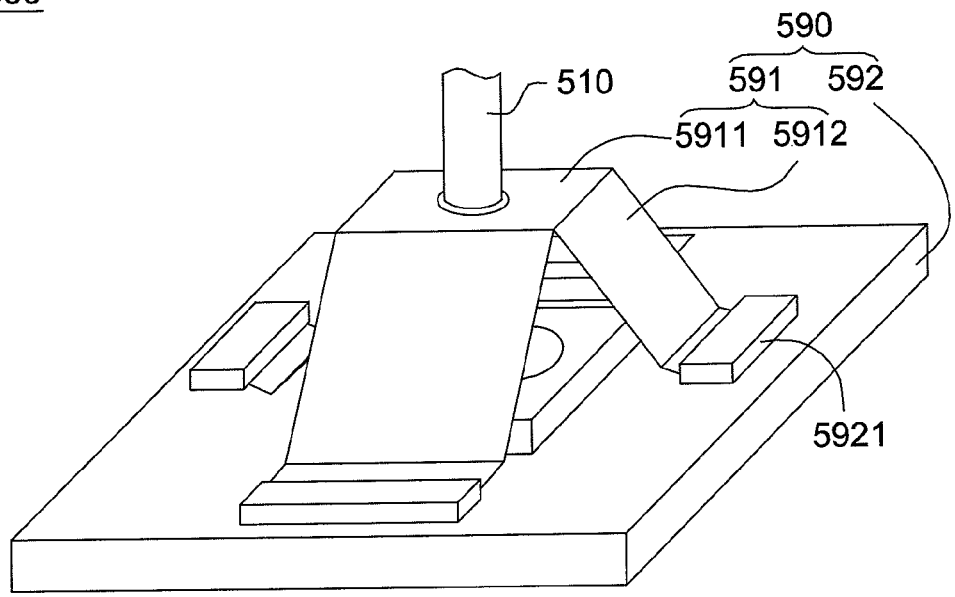
FIG. 14A illustrates a 3D diagram of a semiconductor light source device of a fifth embodiment.
Figure 14B:
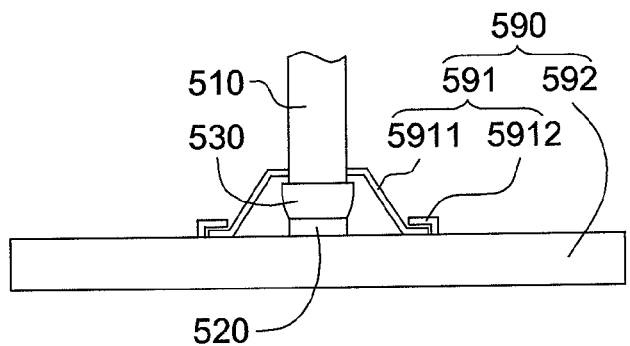
FIG. 14B illustrates a side view of the semiconductor light source device of the fifth embodiment.

Referring to FIGS. 14A to 14B. FIG. 14A illustrates a 3D diagram of a semiconductor light source device 5000 of a fifth embodiment. FIG. 14B illustrates a side view of the semiconductor light source device 5000 of the fifth embodiment. The semiconductor light source device 5000 of the present embodiment is different from the semiconductor light source device 1000 of the first embodiment in that the present embodiment further employs a fixer 590, and other similarities are not repeated.

In the embodiment indicated in FIG. 14B, the fixer 590 is used for fixing the light guide 510 and the light transformation coupler 530, such that the light guide 510 contacts with the light transformation coupler 530. The fixer 590 includes a clamping piece 591 and a carrier board 592. The semiconductor light source set 520 is disposed on the carrier board 592. The clamping piece 591 includes a fixing plate 5911 and several elastic pieces 5912. The light guide 510 is inserted into the fixing plate 5911, and the elastic piece 5912 is engaged with the hook 5921 of the carrier board 592, such that the light guide 510 is clamped above the carrier board 592. Since the elastic piece 5912 is deformed to a certain degree, the light guide 510 is contacted with the light transformation coupler 530, and the light coupling efficiency is thus increased.

In an embodiment, the light transformation coupler 530 is not employed, and the light emitted from the semiconductor light source set 520 is directly received by the light guide 510. Likewise, the fixer 590 fixes and makes the light guide 510 contacted with the semiconductor light source set 520, such that the light coupling efficiency is thus increased.

Sixth Embodiment

Figure 15A:
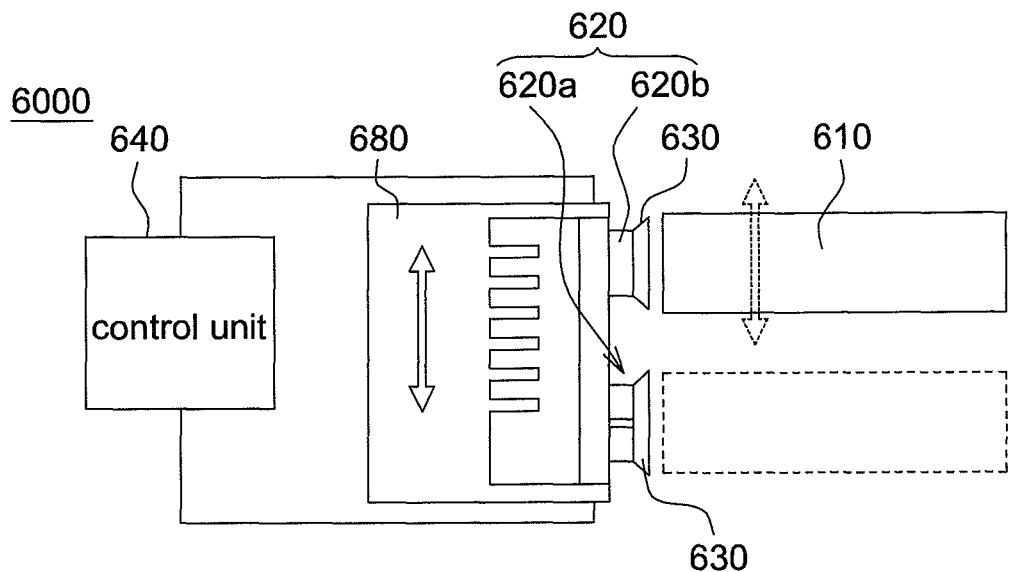
FIG. 15A illustrates a side view of a semiconductor light source device of a sixth embodiment.
Figure 15B:
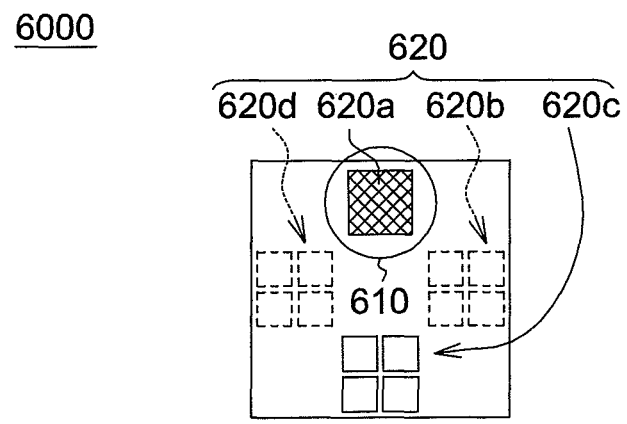
FIG. 15B illustrates a top view of the semiconductor light source device of the sixth embodiment.

Referring to FIGS. 15A to 15B. FIG. 15A illustrates a side view of a semiconductor light source device 6000 of a sixth embodiment. FIG. 15B illustrates a top view of a semiconductor light source device 6000 of a sixth embodiment. The semiconductor light source device 6000 of the present embodiment is different from the semiconductor light source device 4000 of the fourth embodiment in the relationship between the semiconductor light source set 620 and the light guide 610, and other similarities are not repeated.

In the present embodiment, the quantity of the semiconductor light source set 620 is four; the quantity of the light transformation coupler is four. For example, the semiconductor light source set 620 has four semiconductor light source sets 620a, 620b, 620c and 620d. The movable platform 680 is used for moving the semiconductor light source sets 620a, 620b, 620c and 620d and the light transformation couplers 630 to adjust the light guide 610 to be corresponding to one of the light transformation coupler 630, such that the light guide 610 only receives the light emitted from one of the light transformation couplers 630.

Let the embodiment indicated in FIGS. 15A to 15B be taken for example. The semiconductor light source set 620a disposed at the top corresponds to a light transformation coupler 630, and the semiconductor light source set 620c disposed at the bottom corresponds to another light transformation coupler 630. The semiconductor light source set 620a disposed at the top emits a white light whose wavelength is such as 415 nm, and the semiconductor light source set 620c disposed at the bottom emits a narrow-band light whose wavelength is such as 530 nm. The control unit 640 is electrically connected to the movable platform 680 for controlling the movement of the movable platform 680. The movable platform 680 may move the semiconductor light source sets 620a, 620b, 620c and 620d and the light transformation coupler 630, such that the light received by the light guide 610 switches between the white light and the narrow-band light. In general, the white light is used in surgery illumination, and the narrow-band light is used in auxiliary diagnosis of cancer or other pathological changes.

In an embodiment, the movable platform 680 may move the light guide 610 such that the light guide 610 moves relatively to the semiconductor light source sets 620a, 620b, 620c and 620d and the light transformation coupler 630 to switch between the white light and the narrow-band light.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A semiconductor light source device, comprising:
   a light guide;
   at least one semiconductor light source set; and
   at least one light transformation coupler disposed between the semiconductor light source set and the light guide for guiding a light emitted from the semiconductor light source set to the light guide;
   wherein the light transformation coupler has an inclined surface and a curved surface, and the inclined surface is a multi-level inclined surface with several slopes, wherein the slopes of at least two levels of the multi-level inclined surface are expressed by formulas:

$$D_1 * \tan \theta_{c,1} + D_2 * \tan \theta_{c,2} \le L_f - L_s, \theta_{c,2} \le \theta_{c,1}$$

wherein $D_1$ denotes thr projection length of the first level inclined surface on the center axis; $D_2$ denotes the projection length of the second level inclined surface on the center axis; $\theta_{c,1}$ denotes the angle between the first level inclined surface and the center axis; $\theta_{c,2}$ denotes the angle betwreen the second level inclined surface and the center axis. $L_f$ denotes the radius of the light guide; and $L_s$ denotes half of an edge of the semiconductor ligit source set.

2. The semiconductor light source device according to claim 1, the inclined surface and the curved surface are used for reflecting the light emitted from the semiconductor light source set.

3. The semiconductor light source device according to claim 2, wherein the shape of the curved surface has the shape of a cross section of a sphere, an ellipse,or a parabola.

4. The semiconductor light source device according to claim 1. wherein the light transformation coupler has a first terminal surface and a second terminal surface, the shape of the first terminal surface is substantially the same with that of the semiconductor light source set, and the shape of the second terminal surface is substantially the same with a cross-section of the light guide.

5. The semiconductor light source device according to claim 4, wherein the first terminal surface is contacted with the semiconductor light source set.

6. The semiconductor light source device according to claim 4, wherein a gap between the first terminal surface and the semiconductor light source set is smaller than or equal to 0.5 mm.

7. The semiconductor light source device according to claim 1, wherein the quantity of the at least one semiconductor light source set is one, and the semiconductor light source set is formed by a light emitting diode (LED) or a plurality of LEDs.

8. The semiconductor light source device according to claim 1, wherein the quantity of the semiconductor light source set is plural, and each semiconductor light source set is formed by an LED or a plurality of LEDs 9. The semiconductor light source device according to claim 1, wherein the quantity of the semiconductor light source set is plural, the quantity of the light transformation coupler is plural, and the semiconductor light source device further comprises:
a spectroscope group disposed between the light transformation couplers and the light guide for mixing the lights emitted from the semiconductor light source sets.

10. The semiconductor light source device according to claim 1, wherein the quantity of the at least one semiconductor light source set is plural, the colors or color temperatures of the semiconductor light source sets are different, the light transformation coupler has a plurality of first terminal surfaces and a second terminal surface, and each first terminal surface corresponds to one of the semiconductor light source sets.

11. The semiconductor light source device according to claim 1, wherein the quantity of the at least one semiconductor light source set is plural, the quantity of the at least one light transformation coupler is plural, each light transformation coupler is for guiding the light emitted from each semiconductor light source set, the light guide receives at least a part of the light emitted from each semiconductor light source set, and the semiconductor light source device further comprises:
a movable platform used for moving the semiconductor light source sets and the light transformation couplers to adjust the ratio of the lights emitted from the semiconductor light source sets and received by the light guide.

12. The semiconductor light source device according to claim 1, further comprising:
a fixer used for fixing the light guide and the light transformation coupler, such that the light guide is contacted with the light transformation coupler.

13. The semiconductor light source device according to claim 1, wherein the quantity of the at least one semiconductor light source set is plural, the quantity of the at least one light transformation coupler is plural, each light transformation coupler is for guiding the light emitted from one of the semiconductor light source sets, the light guide only receives the light emitted from one of the semiconductor light source sets, and the semiconductor light source device further comprises:
a movable platform used for moving the semiconductor light source sets and the light transformation couplers to adjust the light guide to be corresponding to one of the light transformation couplers.

* * * * *